United States Patent [19]

Crooks

[11] Patent Number: 4,698,593
[45] Date of Patent: Oct. 6, 1987

[54] APPARATUS AND METHOD FOR T1 NMR IMAGING USING SPIN ECHO NMR RESPONSES ELICITED BY INITIAL EXCITATION PULSES OF DIFFERING NUTATION VALUES

[75] Inventor: Lawrence E. Crooks, Richmond, Calif.

[73] Assignee: The Regents of the University of California, Berkeley, Calif.

[21] Appl. No.: 781,736

[22] Filed: Sep. 30, 1985

[51] Int. Cl.$^4$ ............................................. G01R 33/20
[52] U.S. Cl. ..................................................... 324/309
[58] Field of Search ............... 324/307, 309, 310, 311, 324/312, 313, 314

[56] References Cited

U.S. PATENT DOCUMENTS

| 4,297,637 | 1/1981 | Crooks et al. | 324/309 |
| 4,318,043 | 4/1982 | Crooks et al. | 324/309 |
| 4,471,305 | 7/1984 | Crooks et al. | 324/309 |
| 4,486,709 | 12/1984 | Bendall | 324/309 |

OTHER PUBLICATIONS

M. S. Lin, "Measurement of Spin–Lattice Relaxation Times in Double Spin–Echo Imaging", Magnetic Resonance in Medicine, vol. 1, No. 3, Sep. 1984, pp. 361–369.
Bendall et al., "Theoretical Description of Depth Pulse Sequences, On and Off Resonance, Including Improvements and Extensions Thereof", Magnetic Resonance in Medicine, vol 2, No. 2, Apr. 1985.
"A New Look at the Method of Variable Nutation Angle for the Measurement of Spin–Lattice Relaxation Times Using Fourier Transform NMR", by Gupta J. Mag. Res. 25, 231–235 (1977).
The Review of Scientific Instruments, vol. 37, No. 1, Jan. 1966, "Application of Fourier Transform Spectroscopy to Magnetic Resonance", pp. 93–102.

Primary Examiner—Jerry W. Myracle
Assistant Examiner—Kevin D. O'Shea
Attorney, Agent, or Firm—Nixon & Vanderhye

[57] ABSTRACT

NMR response data usable to form a T1 NMR image is obtained by using constant repetition rate data acquisition cycles but wherein different initial nuclei nutation angles are employed to elicit NMR spin echo signal responses. Because of the different initial nutation angles employed to elicit the NMR responses, those responses will differ in accordance with an exponential function of the T1 spin-lattice relaxation time constant of the region under test. Once such T1-dependent data is captured, the T1 time constant may be calculated or otherwise derived (e.g. by an empirical best fit to an exponential curve of known time constant) to produce a T1 value for each incremental volume element (voxel) of the volume under test (e.g. a planar volume). In this manner a visual image of the T1 NMR parameter is created when the complete array of derived T1 values is converted to gray-scale (or color) values and displayed as corresponding picture elements (pixels) in a raster-scanned CRT display or the like. Such an approach may provide a significant speed improvement in the overall data acquisition time required to derive a T1 NMR image. Such speed improvements may be especially useful where large numbers of multiple slices through the object under test are being examined.

22 Claims, 5 Drawing Figures (T1 NMR IMAGING USING VARIABLE FLIP ANGLE/CONSTANT REPETITION RATE)

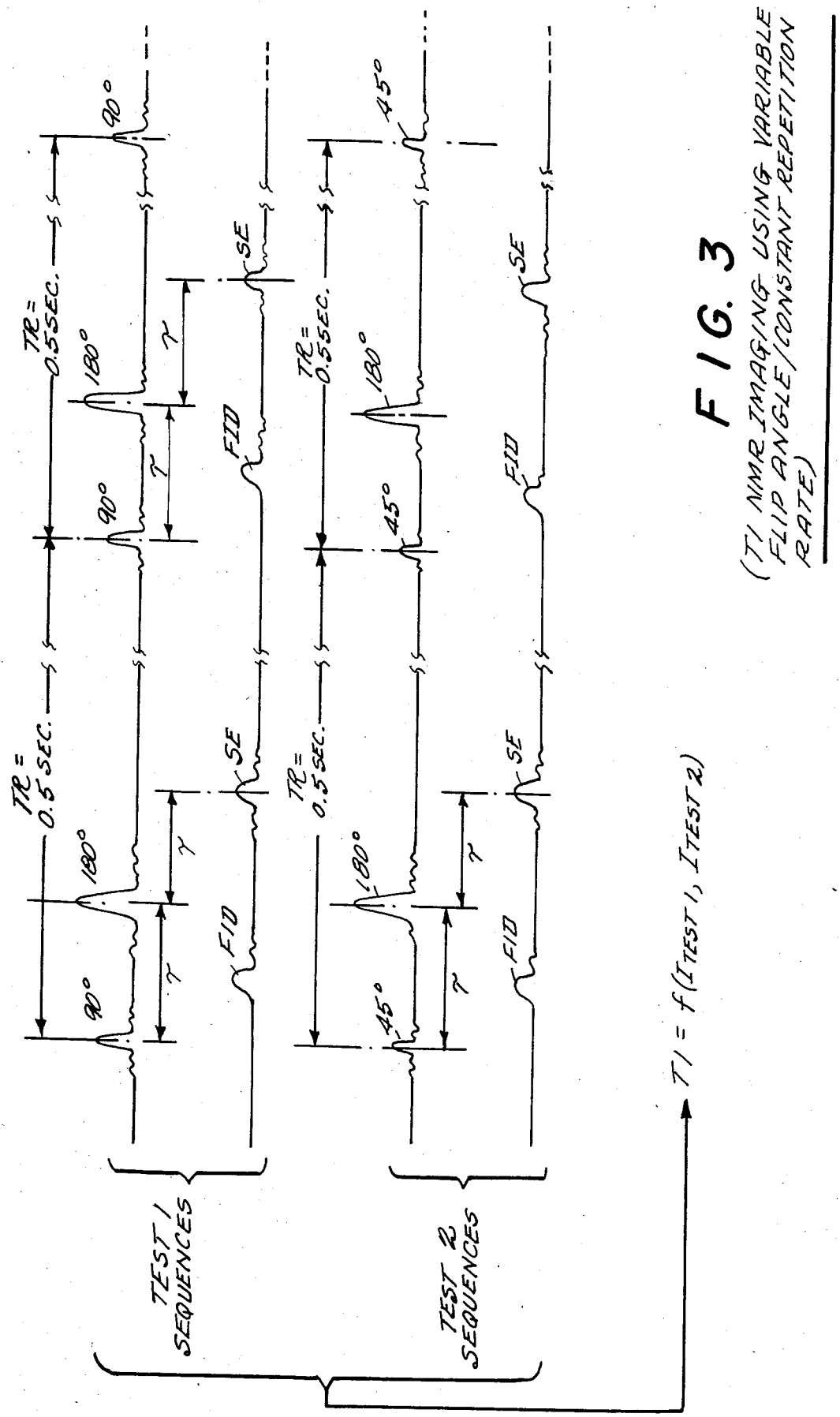

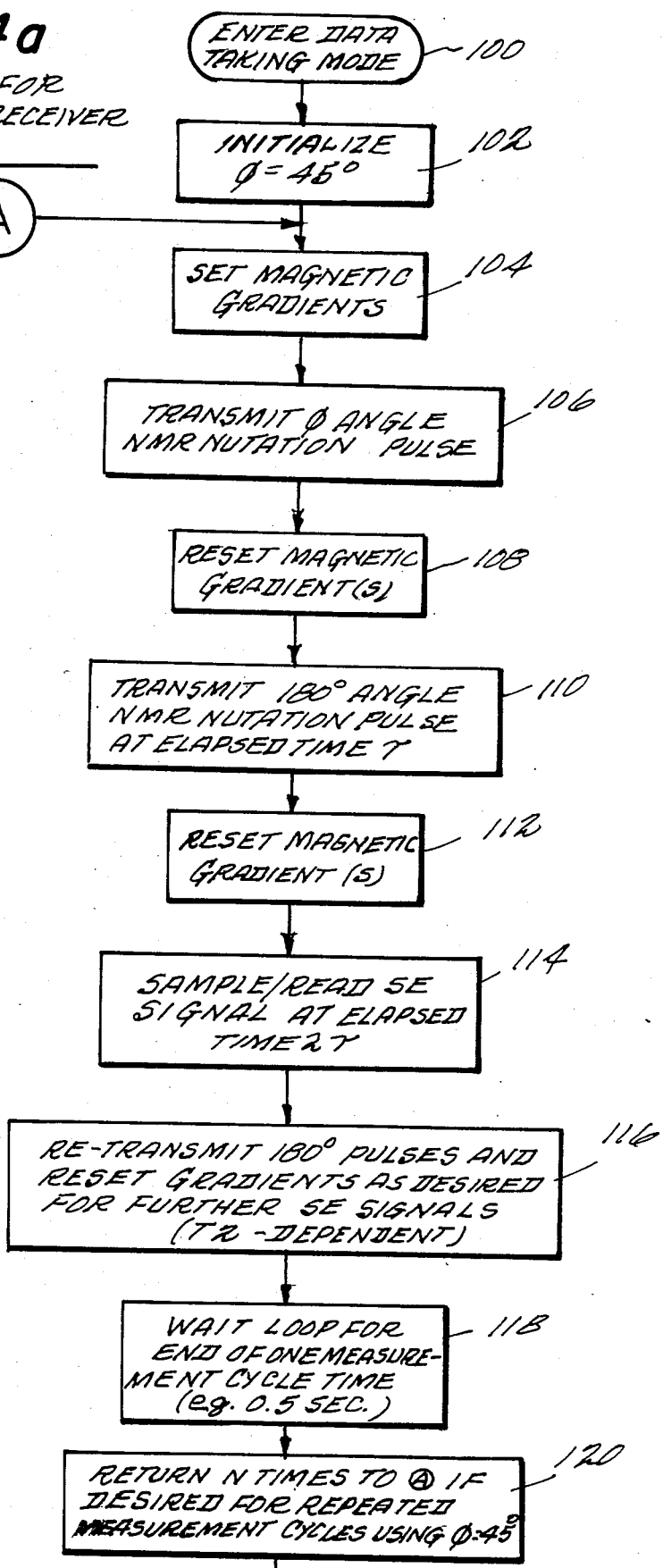

APPARATUS AND METHOD FOR T1 NMR IMAGING USING SPIN ECHO NMR RESPONSES ELICITED BY INITIAL EXCITATION PULSES OF DIFFERING NUTATION VALUES

This invention relates to apparatus and method for NMR (nuclei magnetic resonance) imaging wherein data representing the internal distribution of selected molecular structures within an object under test is obtained using nuclear magnetic resonance phenomena.

This application is related to the following commonly assigned patents and patent applications:
U.S. Pat. No. 4,297,637—Crooks et al (1981)
U.S. Pat. No. 4,318,043—Crooks et al (1982)
U.S. Pat. No. 4,471,305—Crooks et al (1984)
U.S. Pat. No. 4,599,565—Hoenninger (1986)
U.S. Pat. No. 4,607,225—Crooks (1986)
U.S. Pat. No. 4,604,579—Cannon et al. (1986)
U.S. application Ser. No. 515,857, filed July 21, 1983 for Cannon et al.

The entire disclosure contained in each of the above-identified related patents and patent applications is hereby expressly incorporated by reference.

As explained in the aforementioned related patents/applications, and as is well known in the art, there are at least two major time periods associated with NMR responses from a particular group of nuclei. Such time periods are the exponential time-constants T1 and T2 respectively associated with the so-called "spin-lattice" relaxation time and with the "spin-spin" relaxation time of nuclei undergoing NMR excitation/response measurement test cycles. The T1 time constant is usually significant longer than the T2 time constant.

As explained in somewhat more detail in the above-referenced U.S. Pat. No. 4,471,305, the intensity I of observed NMR "spin echo" responses for human tissue can be expected to approximately follow the following exponential equation (assuming that TR is longer than about $3 \times T2$):

$$I = H f(v) \exp(-TE/T2)[1-\exp(-TR/T1)] \sin\theta / [1-\cos\theta \exp(-TR/T1)]$$ (Equation 1)

I = observed spin echo NMR intensity associated with a given volume of nuclei
H = local hydrogen density
f(v) = a function of both the speed with which hydrogen nuclei move through the region being imaged and of the fraction of the total number of nuclei that are moving
TE = T2 timing parameter of the NMR instrument (e.g. the elapsed time period between initial NMR excitation and the spin echo response)
T2 = spin-spin relaxation time constant of local hydrogen nuclei
TR = T1 timing parameter of the NMR instrument (e.g. the total elapsed time between successive NMR measurement cycles)
T = spin-lattice relaxation time constant of local hydrogen nuclei
$\theta$ = angle nuclei are nutated by RF pulse In the situation where $\theta = 90°$, the Equation 1 reduces to the usual form set forth in the related U.S. Pat. No. 4,471,305 because $\sin 90° = 1.0$ and $\cos 90° = 0$.

It is now also known that some systematic error in calculated T1 values can result if the effects of the 180° r.f. flipping pulses are ignored. See, for example, Measurement of Spin-Lattice Relaxation Times in Double Spin-Echo Imaging" by Max S. Lin, Magnetic Resonance in Medicine 1, 361–369 (1984).

The T2 timing parameter "TE" of the NMR instrument is a measure of the time delay between the initial NMR nutation excitation and a subsequent 180° NMR pulse applied so as to elicit a spin echo at a corresponding further equal time delay in accordance with the "Rule of Equal Times". Additional 180° nutation pulses may also be applied in succession so as to elicit a succession of spin echo NMR responses during a single complete measurement cycle. In this manner, different "TE" machine parameters can be realized within a single measurement cycle such that measured intensity data having only T2-dependence can be obtained from which T2 values for the area under test can be derived from the foregoing equation (e.g. by best fitting the measured T2-dependent data to exponential curves having known T2 parameters) and thus produce a T2 image. It is, of course, here assumed that the H, f(v) and "TR" machine parameters remain constant during the data gathering activity so as to permit true T2-dependent data to be obtained.

As also explained in many of the above-referenced related patents/applications, the T1 timing parameter "TR" of the NMR instrument is related to the period of one complete measurement cycle in a repetitive sequence of such cycles. As there explained, one may use different repetition rates for some of the measurement cycles (by use of a different "TR" machine parameter) so as to obtain measured intensity NMR response data having only T1-dependency. From such T1-dependent data, a T1 NMR image may then be calculated or otherwise derived (e.g. using a best fit to the above Equation 1 for known T1 parameters). Here again, it is of course assumed that the H, f(v) and "TE" machine parameters remain constant so as to produce true T1-dependent data.

The above-referenced related patents both explicitly teach the derivation of T1-NMR images (U.S. Pat. No. 4,297,637 at 8:37-44, and U.S. Pat. No. 4,318,043 at 9:9-13) when $\theta = 90°$.

Accordingly, by employing different repetition rates or periods for the measurement cycles, one can obtain T1 NMR images in accordance with the above-referenced related patents/applications. In the exemplary embodiment of the above-referenced related U.S. Pat. No. 4,471,305 measurement cycle periods of 0.5 seconds and 1.0 seconds were utilized so as to obtain T1-dependent data from which T1 NMR images were derived. However, as should be appreciated, this means that approximately twice as much time is employed for data gathering activities during the measurement cycles where the "TR" machine parameter is made to equal 1.0 seconds as compared to the measurement cycles where the "TR" machine parameter is equal to only 0.5 seconds. Since about one-half of the test cycles would typically be of the longer 1.0 second type, the overall required data acquisition time could be $0.5x + 1.0x = 1.5x$ seconds where x = the number of measurement cycles used for each repetition rate. Typically total data acquisition times may be in excess of one minute. During such long time intervals, it may be difficult to keep f(v) constant (e.g. for living objects). This also implies a rather long dedication of a rather expensive apparatus for gathering NMR data for one patient.

Thus there is a need for improving the data acquisition efficiency of an imaging NMR scanner.

In the earlier proposed exemplary embodiments of the above-referenced related patents/applications, a 90° NMR nutation pulse was typically utilized to initiate an NMR measurement cycle during which one or more spin echo NMR responses was elicited from a selected region of the object under test. The just above discussed prior technique for obtaining T1-dependent NMR data using different repetition rates for the basic NMR measurement cycle was effected, in those exemplary embodiments, under the assumption that the NMR pulse used to initiate each measurement cycle would represent a fixed (e.g. 90°) nutation angle.

However, I have noted that T1-dependent spin echo data may also be obtained by using different values for the initial NMR nutation pulse used to initiate each measurement cycle. In effect, the nutation or "flip" angle associated with the initial NMR excitation pulse of each measurement cycle can become the T1 dependent variable machine parameter of the NMR imaging scanner. And this is so even if the repetition rate of all measurement cycles is maintained at a constant fixed value.

In accordance with one exemplary embodiment of this invention, one might fix the repetition rate of the NMR measurement cycles at a constant 0.5 seconds (2 Hz). Thus the total required data acquisition time would only be 1.0x for a possible 33% improvement in data acquisition efficiency. Some of the measurement cycles would be initiated by, for example, a 90° nutation pulse as already explained in the above-referenced related patents/applications. However other of the measurement cycles could be initiated by a differently valued (e.g. 45°) nutation pulse. In this manner, the resulting measured intensity of NMR responses from at least two such sets of measurement cycles would provide data having T1-dependency from which a T1 NMR image can be calculated or otherwise derived in accordance with conventional practice (e.g. using the above Equation 1 where the nutation angle becomes the control parameter of the NMR instrument).

For example, one might use sequence 1 with $\theta = 90°$ to get signal $S_1$ and sequence 2 with $\theta = 45°$ to get signal $S_2$. Then $S_1 \alpha (1 - e^{-TR/T1})$ and $$S_2 \alpha \frac{(1 - e^{-TR/T1})\frac{\sqrt{2}}{2}}{\left(1 - \frac{\sqrt{2}}{2} e^{-TR/T1}\right)}.$$

Rearranging gives $$T_1 = \frac{TR}{\ln\left[\frac{S_2}{\sqrt{2} S_2 - S_1}\right]}.$$

This is a fairly simple calculation for $T_1$.

In the preferred exemplary embodiment, the repetition interval for the measurement or data acquisition cycles is maintained at a constant value (e.g. 0.5 seconds) so as to condense the overall time required for data acquisition to a minimum. However, as those skilled in the art will appreciate in view of the present disclosure, one might also vary the repetition rate somewhat and still be able to employ differently valued initial NMR excitation pulses to initiate different sets of individual measurement cycles so as to obtain T1-dependent data.

To simplify the explanation of the present invention, the details by which the observed NMR intensity values I are obtained for a given incremental volume element (voxel) are not here repeated. Any conventional techniques may be employed and they may include the use of one-, two- or three-dimensional Fourier transforms or other techniques as may be apparent to those in the art and/or as explained in more detail in the above-referenced related patents/applications. This invention is believed to have utility with any of the various spin echo NMR response measurement techniques disclosed in the above-referenced related patents/applications.

Similarly, to simplify the explanation of the present invention, details concerning the generation of necessary magnetic gradient pulses during a given measurement cycle are not repeated. The reader is referred to the above-referenced related patents/applications which describe the manner in which various x, y, z magnetic gradient pulses are imposed upon a static magnetic field during NMR excitation signals (and "correction" gradient fields applied at various times throughout a measurement cycle) as well as during the read-out of an elicited spin echo NMR response signal. The area of the slice selective gradient pulse which is reversed immediately following the initial nutation RF pulse may have to be adjusted for each value of flip angle. Accordingly, throughout the remainder of this disclosure, it will simply be assumed that these as well as other necessary details apparent to those skilled in the art have been conventionally implemented and/or that they have been implemented in accordance with the general guidelines, principles and teachings of the above-referenced related patents/applications.

It should be understood that coherent r.f. modulation/demodulation processes may be employed. This permits desirable accumulation of plural spin echo signals from many separate measurement cycles which may be combined in various ways prior to Fourier analysis, for example. Once again, the reader is referred to the above-referenced related patents/applications for details, if desired.

These as well as other objects and advantages of this invention will become better understood by reading the following detailed description of a presently preferred exemplary embodiment of the invention taken in conjunction with the accompanying drawings, of which:

Figure 1:
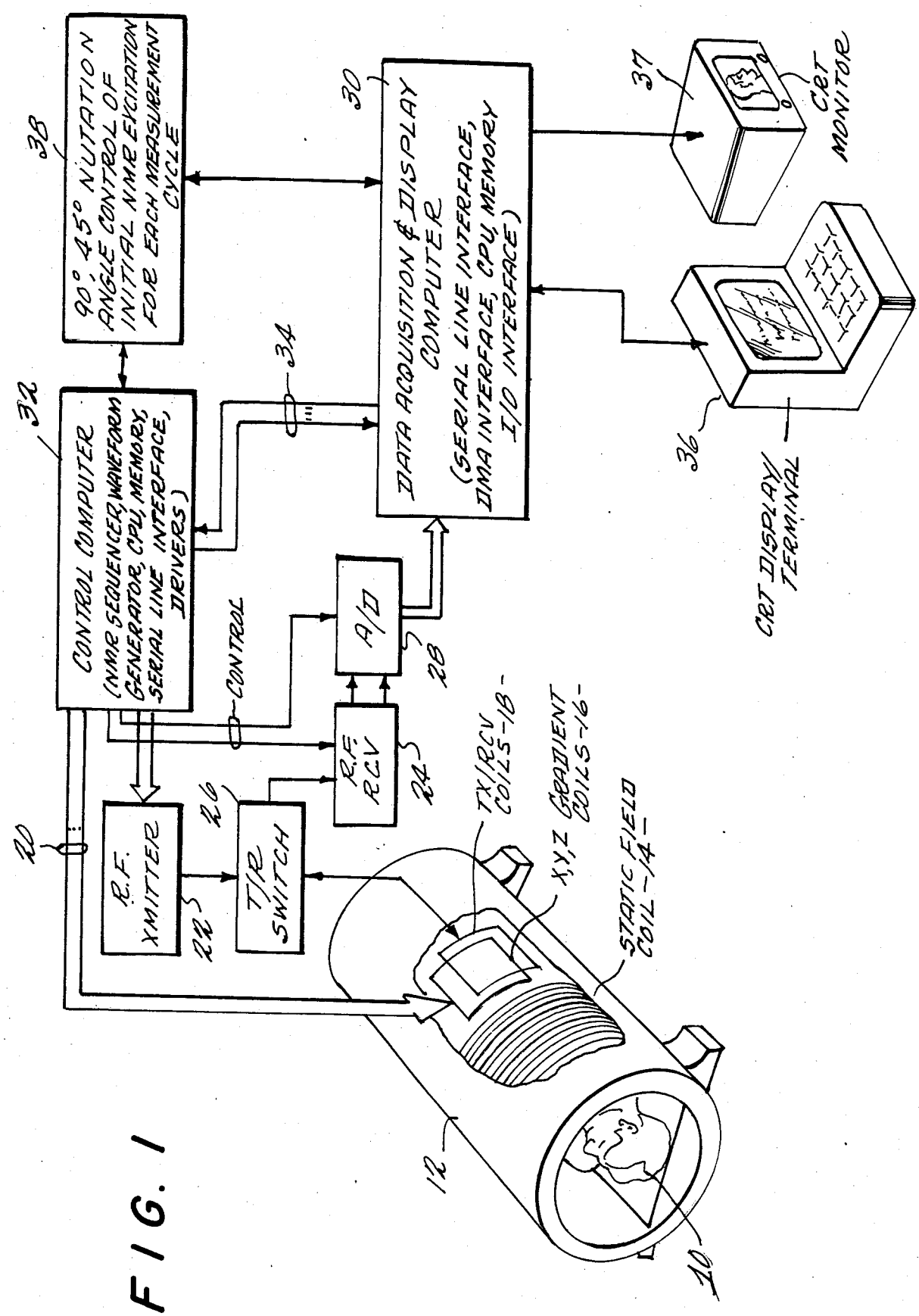
FIG. 1 is a schematic depiction of an overall imaging NMR scanning in accordance with this invention.
Figure 2:
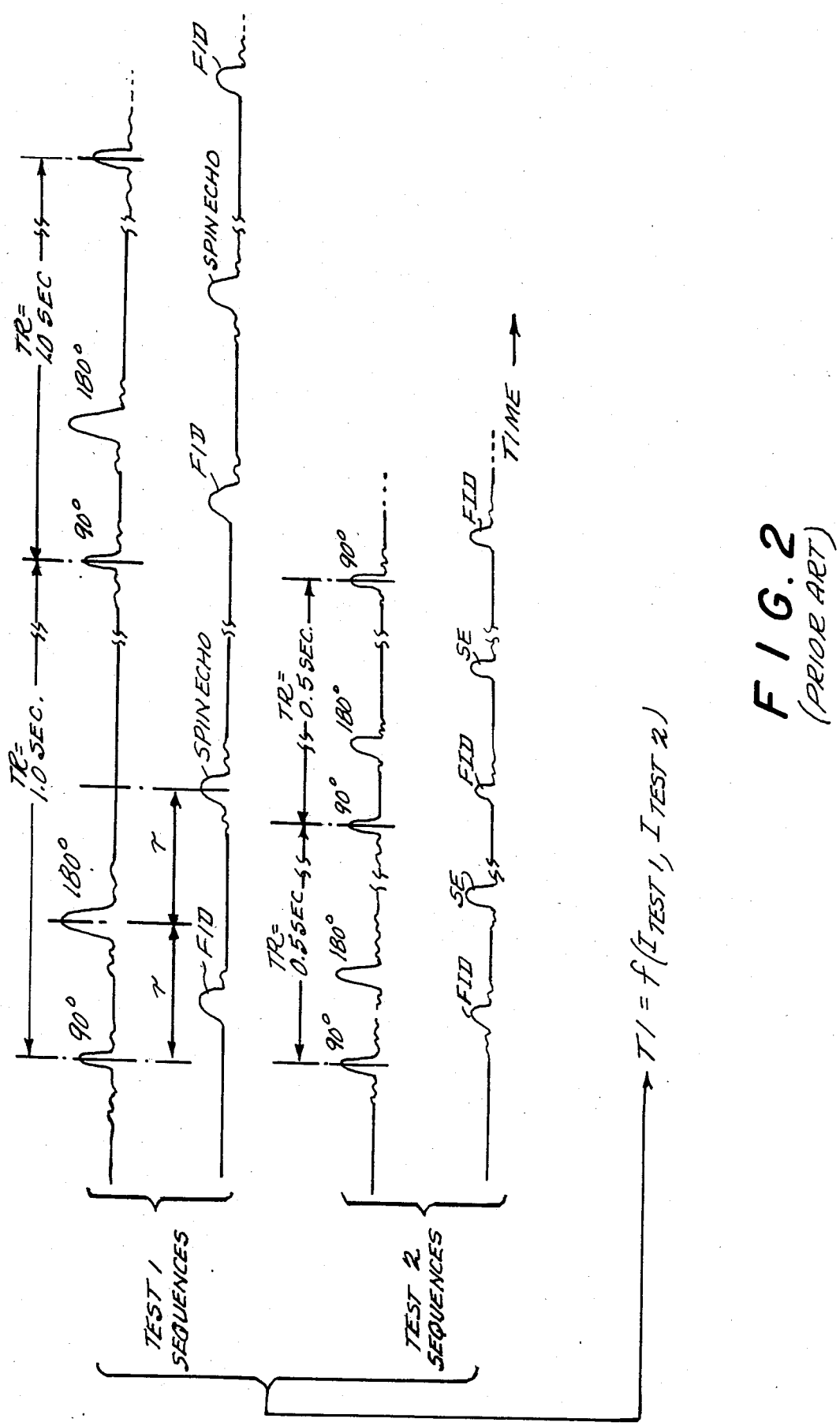
FIG. 2 is a waveform diagram illustrating a typical prior art technique for eliciting T1-dependent data from at least two different measurement test cycle sequences employing different repetition rates.
Figure 4B:
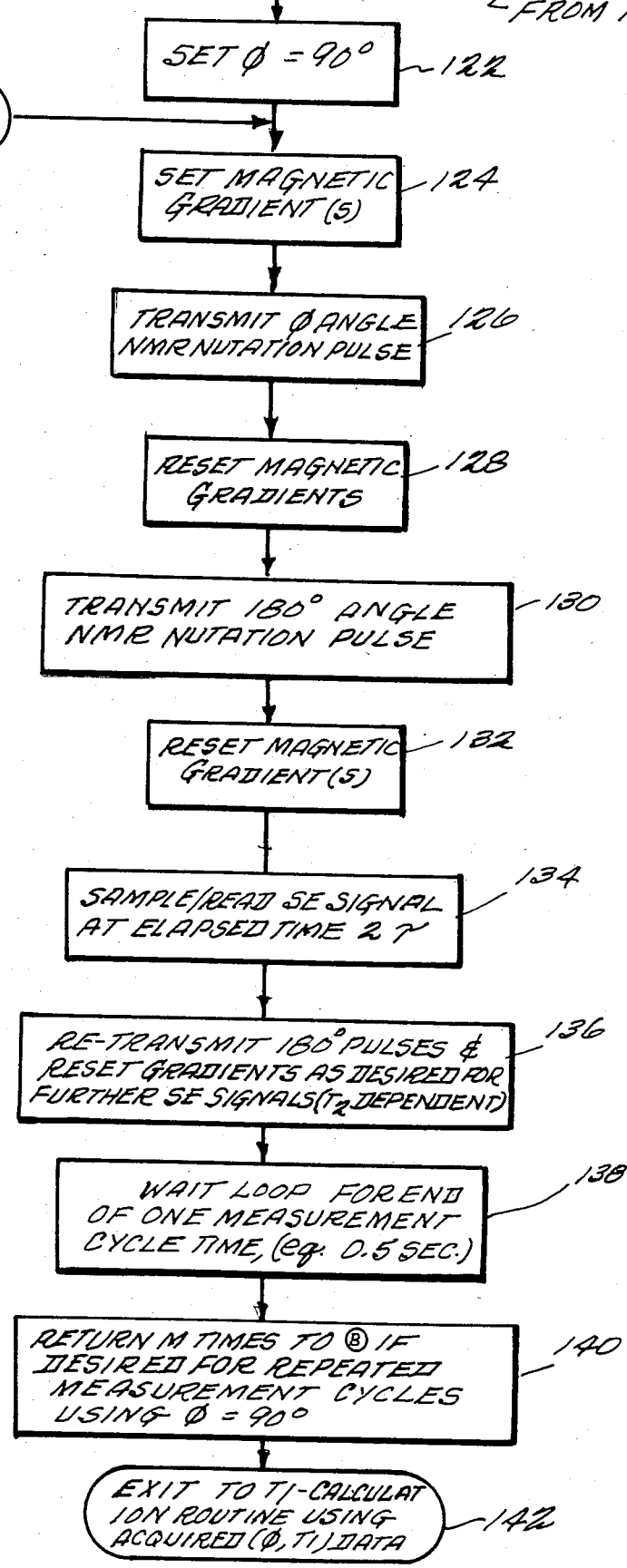

FIG. 3 is a waveform diagram similar to that of FIG. 2 but illustrating an exemplary embodiment of the present invention used in conjunction with the apparatus of FIG. 1 to derive T1-dependent NMR spin echo responses using at least two measurement cycle test sequences but wherein the repetition rate of such sequences may be at a constant fixed lower value (e.g. 0.5 seconds); and FIGS. 4a and 4b are a simplified exemplary flow chart (analogous to that of FIGS. 6A–6E in the above-referenced related application Ser. No. 331,008 and/or to that of FIGS. 18A–19B in Ser. No. 515,117) descriptive of a suitable program for the computerized control apparatus of FIG. 1 which implements the exemplary sequence of measurement cycles shown in FIG. 3 for selectively varying the nutation angle associated with the initial NMR excitation pulse used to initiate a given measurement cycle.

The details of a complete imaging NMR scanner as depicted in FIG. 1 are supplied more completely in the above-referenced related patents/applications. In brief overview, the patient or other object under examination 10 is placed within a large cryogenic electromagnetic assembly 12 which includes a static magnetic field coil 14 and, typically, x, y and z magnetic gradient coils 16. Radio frequency transmit/receive coils 18 are also included in the assembly to permit NMR excitation r.f. signals to be transmitted into the object under test 10 and NMR response r.f. signals to be received therefrom. The x, y, z gradient coils 16 are typically driven over lines 20 with pulsed drive currents having selected amplitude and duration and timing within a given measurement cycle so as to cause only selected regions of the object under test 10 to be responsive to transmitted NMR signals and/or to provide various corrections (e.g. "phasing" corrections) and/or to encode an NMR spin echo response as it is being read out during a given NMR measurement cycle. A radio frequency transmitter 22 and radio frequency receiver 24 are given controlled sequential access to the common r.f. coils 18 via a transmit/receive switch 26 (which might actually comprise a "magic T" or non-reciprocal r.f. "circulator" as will be appreciated). Typically, the output of the r.f. receiver is digitized in an analog-to-digital converter 28 before or as it is being input to the data acquisition and display computer 30. The overall sequence of NMR excitation transmissions, waveform generation for both the r.f. transmissions and magnetic gradient coil drivers, etc. may typically be carried out in a separate control computer system 32 which communicates, for example, over a serial line interface 34 with the data acquisition and display computer 30. A CRT display/keyboard terminal 36 is employed for overall control of the imaging NMR scanner and/or controlling the actual display of images derived thereby on CRT monitor 37.

The imaging NMR scanner of FIG. 1 is further modified (typically by suitable modification of the controlling programs utilized in the data acquisition and display computer 30 and/or in the control computer 32 as depicted in block 38) so as to be capable of selectively using a different (e.g. either a 90° or 45°) nutation angle for the initial NMR excitation pulse used in each measurement cycle. Typically, the modified program represented by block 38 would be embodied in the modified physical structure of digital memory devices such as RAM, ROM, magnetic disks, etc. so as to implement the modified NMR test sequences to be further described with respect to FIGS. 3 and 4.

An exemplary set of test sequences used in the above-referenced related patents/applications for deriving T1-dependent test data is depicted at FIG. 2. (As earlier mentioned, depiction of the necessary magnetic gradient pulses has been omitted to simplify the explanation of the present invention.) Here, for example, it will be seen that successive "test 1" sequences are each initiated by a 90° nutation pulse followed by one or more 180° nutation pulses giving rise to one or more corresponding spin echo NMR response signals in accordance with the "Rule of Equal Times"—all during successive 1.0 second measurement cycles. At another time, similar "test 2" sequences are employed but for repetitive measurement cycles having a reduced period of only 0.5 seconds. As depicted in FIG. 1, the result is T1-dependent data such that the T1 NMR parameter for a given elemental volume (i.e. voxel) can be calculated or otherwise derived as a function of the measured test 1 and test 2 data. When space/time multiplexing (see above-listed related patents) is used the 1.0 sec cycles allow 10 slices to be imaged while the 0.5 sec cycles only allow 5 slices. Thus one can calculate T1 images for only 5 of the 10 slices of the 1.0 sec data.

The exemplary embodiment of this invention depicted at FIG. 3 shows a "test 1" sequence similar to the shortened "test 2" sequence of FIG. 2. Namely, each measurement cycle is initiated with a 90° nutation NMR excitation pulse and the period of such repeated measurement cycles is 0.5 seconds.

However, the "test 2" sequences depicted in FIG. 3 are initiated by a different initial NMR excitation pulse. Namely, in this exemplary embodiment, by a 45° nutation angle pulse. Even though the repetition rate of the measurement cycles is the same fixed value (e.g. 0.5 seconds period or 2 Hz), the resulting measured spin echo responses resulting from the two different test sequences produce T1-dependent data from which the T1 parameter for a given voxel can be calculated or otherwise derived using such measured test data. For multi-slice imaging one now has two sets of matching 5 slice data for 5 T1 images with a ⅓ reduction in imaging time.

As earlier explained, the preferred exemplary embodiment utilizes a fixed minimum length period (which minimum may, in a given case, be significantly less than even 0.5 seconds) for the measurement cycles in both test sequences of FIG. 3. It would also be possible to utilize somewhat different periods for the measurement cycles in different sets of test sequences while still using different nutation angles for the initating NMR excitation pulse to derive T1-dependent data from which a T1 image can be derived.

Although the above description relates to the derivation of a T1 NMR value for an elemental volume or voxel of an object under test, those in the art will appreciate that when such T1 values are similarly derived for a multitude of contiguous voxels, the resulting array of contiguous T1 voxel values can be visually displayed as contiguous picture elements or "pixels" on a CRT screen or other visual display medium in accordance with conventional and well known video processing techniques. Accordingly, such details will not be further described in this document.

One exemplary subprogram for the transmitter/receiver control (analogous to that shown in FIGS. 6A–6E of the above-referenced related U.S. Pat. No. 4,471,305 or in FIGS. 18A–19B of Ser. No. 515,117) is depicted at FIG. 4. Those in the art should now appreciate that this invention can be practiced by making relatively minor modifications in the controlling programs for control computer 32 and/or the data acquisition and display computer 30 (the latter may, for example, exert effective control over the control computer 32 via interface 34) such that differently valued NMR excitation pulses are utilized to initiate different sets of measurement cycles (e.g. such as those depicted in FIG. 3).

Entry to the exemplary subprogram of FIG. 4 may be had at block 100 from a higher level executive control or other program when it is desired to enter a data taking mode of operation. Standard initialization steps are taken at 102. For example, the flip angle or nutation angle to be associated with an initiating NMR excitation pulse may here be set to some predetermined value (e.g. 45°). As should now be appreciated, this and/or any other predetermined value may be a fixed value embedded within the program and/or it may be a "soft" value input via the keyboard, for example, of terminal 36 under operator control. (Different subroutines for different initiating nutation angles may be stored in digital memory and selectively activated via operator keyboarded entries.) Desired magnetic gradients are set up at 104. (As those in the art will appreciate, such gradients should be of proper magnitude and properly timed in duration and occurrence as is shown in more detail in the above-referenced related patents/applications and therefore not shown in more detail at FIG. 4.)

At block 106, transmitter 22 is energized to transmit the initializing NMR nutation pulse associated with the desired predetermined nutation angle set at block 102. Thereafter magnetic gradient fields are reset or set as desired. At a desired elapsed time (related to the "TE" machine parameter having T2 dependence) a 180° nutation angle NMR pulse is transmitted at 110. Magnetic gradients are again set or reset as desired at 112 and the resulting spin echo signal is then sampled, digitally read and stored for later processing at 114. If desired, additional 180° nutation pulses are transmitted at 116 so as to elicit further spin echo signals having T2-dependency during a given single measurement cycle. At 118, a "wait" loop is entered to wait until the end of a given measurement cycle (e.g. in the exemplary embodiment, the overall measurement cycle measured between the initial excitation pulses transmitted at block 106 would be 0.5 seconds). Thereafter, at block 120, one may return to point A in the flow chart, if desired, for repeated measurement cycles in a given test sequence using the same nutation angle to initiate each measurement cycle. (Different slice selective frequencies may be utilized on successive passes so as to effect space/time multiplexing over a single T1 line interval as described in the above-reference related patents/applications. In this case the delay at 118 is such that when repeatedly added to the time required to image each slice the total time to return to the next measurement of any particular slice is 0.5 sec.) After the desired N times repetition of measurement cycles using a 45° nutation angle for initiation, the initial nutation angle is reset at 122 to a different predetermined value (e.g. 90°). Thereafter, appropriate magnetic gradients are set as desired at block 124 in preparation for transmission of the 90° nutation pulse at 126 to initiate a new sequence of measurement cycles using a different nutation angle at the outset of each.

Magnetic gradients are reset as desired or necessary at 128 and a 180° nutation angle NMR pulse is transmitted at 130 after the appropriate elapsed time (in accordance with the selected "TE" machine parameter). Magnetic gradients are again set, reset as desired at 132 and the resulting spin echo response signal is sampled, digitized and stored as desired at 134. Additional 180° NMR pulses may be transmitted at 136 so as to elicit further spin echo signals within a given measurement cycle before entering a wait loop at 138 which times out at the end of a measurement cycle (e.g. 0.5 seconds elapsed from the transmission of the initiating NMR nutation pulse at block 126). Thereafter, one may return a desired number of M times to point B in the flow chart from block 140 so as to repetitively perform measurement cycles using an initiating NMR pulse associated with the 90° nutation angle. (Different slice selective frequencies may be utilized on successive passes so as to effect space/time multiplexing over a signle T1 time interval as described in the above referenced related patents/applications. In this case the delay at 138 is such that when repeatedly added to the time required to image each slice the total time to return to the next measurement of any particular slice is 0.5 sec.) Finally, after the desired M times repetition, exit from the subroutine of FIG. 4 may be taken at 142 to an appropriate image reconstruction and then T1-calculation or curve-fitting derivation routine (or to any other desired task) as might be determined by a higher level executive program or the like. As earlier explained, once the T1 NMR value has been calculated for a multitude of contiguous voxels, they may be assembled into a visual image and displayed as different gray or color values for corresponding contiguous pixels of a visual display such as that which may be produced by the CRT monitor terminal 37 in accordance with conventional video processing techniques and as will be understood by those in the art.

Although only one exemplary embodiment of this invention has been above-described in detail, those skilled in the art will recognize that many variations and modifications may be made in the exemplary embodiment while yet retaining many of the novel advantages and improvements of this invention. Accordingly, all such modifications or variations are intended to be included within the scope of the appended claims.

What is claimed is:

1. An imaging NMR scanner capable of deriving T1 NMR images of selected internal regions of an object under test using r.f. NMR spin echo signals elicited therefrom, said scanner comprising:

means for transmitting, during successive measurement cycles, an initial predetermined $\phi$ angle nutation pulse of NMR r.f. energy into said object followed by at least one 180° angle nutation pulse of NMR r.f. energy similarly directed for producing at least one spin echo NMR r.f. response signal from said object;

means operatively associated with said means for transmitting for controlling said initial predetermined $\phi$ angle nutation pulse to have a first value $\phi_1$ during at least one measurement cycle and a different second value $\phi_2$ during at least one further measurement cycle; and means for detecting and analyzing the spin echo NMR r.f. response signals elicited from said object during said measurement cycles and for determining T1 NMR values for use in forming a T1 NMR image of selected internal regions of said object using said spin echo NMR r.f. response signals.

2. An imaging NMR scanner as in claim 1 wherein said means for controlling causes said first value $\phi_1$ to be approximately 90° and said second value $\phi_2$ to be approximately 45°.

3. An imaging NMR scanner as in claim 2 wherein said means for transmitting includes means causing said successive measurement cycles to be repeated at a substantially constant repetition rate.

4. An imaging NMR scanner as in claim 3 wherein said means controlling the repetition rate of the measurement cycles controls same to be approximately 2 Hertz.

5. An imaging NMR scanner capable of providing T1 images of selected internal regions of an object under test while using substantially constant repetition intervals between measurement cycles wherein spin echo NMR r.f. signals are elicited, said scanner comprising:

r.f. transmitting means for transmitting timed pulse sequences of r.f. signals including, during each of repeated substantially constant measurement cycle times, (a) an initial $\phi$ NMR nutation r.f. pulse producing a predetermined flip angle $\phi$ and (b) at least one 180° NMR nutation pulse $\tau$ seconds thereafter to elicit at least one NMR spin echo signal SE at $2\tau$ seconds after said $\phi$ pulse;

said r.f. transmitting means including means for causing said initial $\phi$ NMR nutation pulse to have a first value $\phi_1$, during at least a first measurement cycle and a different second value $\phi_2$ during at least a second measurement cycle thereby giving rise to at least corresponding NMR spin echo r.f. signals $SE_1$ and $SE_2$ in respective ones of said measurement cycles, said spin echo signals $SE_1$ and $SE_2$ being different but related by at least the T1 NMR value of the region under test so as to collectively represent said T1 NMR value; and r.f. receiving and signal processing means for receiving said r.f. spin echo signals $SE_1$ and $SE_2$ for deriving said T1 NMR value therefrom.

6. An imaging NMR scanner as in claim 5 wherein said r.f. transmitting means includes means for causing said first value $\phi_1$ to be approximately 90° and for causing said second value $\phi_2$ to be approximately 45°.

7. An imaging NMR scanner as in claim 6 wherein said r.f. transmitting means includes means for causing said measurement cycles to be repeated at time intervals of approximately 0.5 seconds.

8. An imaging NMR scanner for deriving at least one spin echo NMR r.f. signal from selected internal regions of an object under test in response to applied pulses of transmitted r.f. signals during each of successive measurement cycles, wherein components of said spin echo NMR r.f. signals have respective intensities exponentially dependent upon the T1 and T2 NMR parameters of the region under test and are also dependent upon the initial nutation or flip angle $\phi$ corresponding to the initial transmitted r.f. signal pulse used in each measurement cycle to elicit a spin echo response, said scanner comprising:

NMR excitation means for selectively controlling said initial flip angle $\phi$ to have different values for at least some of said measurement cycles whereby data representative of at least the T1 NMR value of the region under test is provided, and NMR detection and analysis means for detecting said spin echo NMR r.f. signals during measurement cycles using different initial flip angles $\phi$ and for determining at least said T1 value therefrom.

9. In an imaging NMR scanner of the type which includes means which repetitively tests selected internal regions of an object by transmitting an initial NMR r.f. nutation pulse followed by at least one 180° NMR r.f. nutation pulse so as to elicit at least one NMR spin echo signal from a selected region during each of successive NMR measurement cycles, the improvement comprising:

control means for causing said initial NMR r.f. nutation pulse to produce a first nutation angle $\phi_1$ during at least one first NMR measurement cycle and to produce a different second nutation angle $\phi_2$ during at least one other second NMR measurement cycle.

10. An improved imaging NMR scanner as in claim 9 further comprising means for causing both of said first and second NMR measurement cycles to have approximately equal durations.

11. An improved imaging NMR scanner as in claim 9 wherein said control means causes $\phi_1$ to be approximately 90° and causes $\phi_2$ to be approximately 45°.

12. An imaging NMR method capable of deriving T1 NMR images of selected internal regions of an object under test using r.f. NMR spin echo signals elicited therefrom, said method comprising the steps of:

tranmitting, during successive measurement cycles, an initial predetermined $\phi$ angle nutation pulse of NMR r.f. energy into said object followed by at least one 180° angle nutation pulse of NMR r.f. energy similarly directed for producing at least one spin echo NMR r.f. response signals from said object;

controlling said initial predetermined $\phi$ angle nutation pulse to have a first value $\phi_1$ during at least one measurement cycle and a different second value $\phi_2$ during at least one further measurement cycle; and detecting and analyzing the spin echo NMR r.f. response signals elicited from said object during said measurement cycles and determining T1 NMR values for use in forming a T1 NMR image of selected internal regions of said object using said spin echo NMR r.f. response signals.

13. An imaging NMR method capable of deriving T1 NMR images of selected internal regions of an object under test using r.f. NMR spin echo signals elicited therefrom, said method comprising the steps of:

transmitting, during successive measurement cycles, an initial predetermined $\phi$ angle nutation pulse of NMR r.f. energy into said object followed by at least one 180° angle nutation pulse of NMR r.f. energy similarly directed for producing at least one spin echo NMR r.f. response signal from said object;

controlling said initial predetermined $\phi$ angle nutation pulse to have a first value $\phi_1$ during at least one measurement cycle and a different second value $\phi_2$ during at least one further measurement cycle; and detecting and analyzing the spin echo NMR r.f. response signals elicited from said object during said measurement cycles and determining T1 NMR values for use in forming a T1 NMR image of selected internal regions of said object using said spin echo NMR r.f. response signals;

said controlling step causing said first value $\phi_1$ to be approximately 90° and said second value $\phi_2$ to be approximately 45°.

14. A method as in claim 13 wherein said transmitting step includes repeating said successive measurement cycles at a substantially constant repetition rate.

15. A method as in claim 14 wherein said controlling step causes the repetition rate of the measurement cycles to be approximately 2 Hertz.

16. An imaging NMR method capable of providing T1 images of selected internal regions of an object under test while using substantially constant repetition intervals between measurement cycles wherein spin echo NMR r.f. signals are elicited, said method comprising the steps of:

transmitting timed pulse sequences of r.f. signals including, during each of repeated substantially constant measurement cycle times, (a) an initial $\phi$ NMR nutation r.f. pulse producing a predetermined flip angle φ and (b) at least one 180° NMR nutation pulse τ seconds thereafter to elicit at least one NMR spin echo signal SE at 2τ seconds after said φ pulse;

controlling said initial φ NMR nutation pulse to have a first value $\phi_1$, during at least a first measurement cycle and a different second value $\phi_2$ during at least a second measurement cycle thereby giving rise to at least corresponding NMR spin echo r.f. signals $SE_1$ and $SE_2$ in respective ones of said measurement cycles, said spin echo signals $SE_1$ and $SE_2$ being different but related by at least the T1 NMR value of the region under test so as to collectively represent said T1 NMR value; and receiving said r.f. spin echo signals $SE_1$ and $SE_2$ and deriving said T1 NMR value therefrom.

17. An imaging NMR method capable of providing T1 images of selected internal regions of an object under test while using substantially constant repetition intervals between measurement cycles wherein spin echo NMR r.f. signals are elicited, said method comprising the steps of:

transmitting timed pulse sequences of r.f. signals including, during each of repeated substantially constant measurement cycle times, (a) an initial φNMR nutation r.f. pulse producing a predetermined flip angle φ and (b) at least one 180° NMR nutation pulse τ seconds thereafter to elicit at least one NMR spin echo signal SE at 2τ seconds after said φ pulse;

controlling said initial φ NMR nutation pulse to have a first value $\phi_1$, during at least a first measurement cycle and a different second value $\phi_2$ during at least a second measurement cycle thereby giving rise to at least corresponding NMR spin echo r.f. signals $SE_1$ and $SE_2$ in respective ones of said measurement cycles, said spin echo signals $SE_1$ and $SE_2$ being different but related by at least the T1 NMR value of the region under test so as to collectively represent said T1 NMR value; and receiving said r.f. spin echo signals $SE_1$ and $SE_2$ and deriving said T1 NMR value therefrom;

said controlling step including controlling said first value $\phi_1$ to be approximately 90° and controlling said second value $\phi_2$ to be approximately 45°.

18. A method as in claim 17 wherein said transmitting step causes said measurement cycles to be repeated at time intervals of approximately 0.5 seconds.

19. An imaging NMR method for deriving at least one spin echo NMR r.f. signal from selected internal regions of an object under test in response to applied pulses of transmitted r.f. signals during each of successive measurement cycles, wherein components of said spin echo NMR r.f. signals have respective intensities exponentially dependent upon the T1 and T2 NMR parameters of the region under test and upon the initial nutation or flip angle φ corresponding to the initial transmitted r.f. signal pulse used each measurement cycle to elicit a spin echo response, said method comprising the steps of:

selectively controlling said initial flip angle φ to have different values for at least some of said measurement cycles whereby data representative of at least the T1 NMR value of the region under test is provided, and detecting said spin echo NMR r.f. signals during measurement cycles using different initial flip angles φ and determining at least said T1 value therefrom.

20. In an imaging NMR method of the type which repetitively tests selected internal regions of an object by transmitting an initial NMR r.f. nutation pulse followed by at least one 180° NMR r.f. nutation pulse so as to elicit at least one NMR spin echo signal from a selected region during each of successive NMR measurement cycles, the improvement comprising:

controlling said initial NMR r.f. nutation pulse to produce a first nutation angle $\phi_1$ during at least one first NMR measurement cycle and to produce a different second nutation angle $\phi_2$ during at least one other second NMR measurement cycle.

21. An improved imaging NMR method as in claim 20 further comprising the step of controlling both of said first and second NMR measurement cycles to have approximately equal durations.

22. In an imaging method of the type which repetitively tests selected internal regions of an object by transmitting an initial NMR r.f. nutation pulse followed by at least one 180° NMR r.f. nutation pulse so as toe elicit at least one NMR spin echo signal from a selected region during each of successive NMR measurement cycles, the improvement comprising:

controlling said initial NMR r.f. nutation pulse to produce a first nutation angle $\phi_1$ during at least one first NMR measurement cycle and to produce a different second nutation angle $\phi_2$ during at least one other second NMR measurement cycle;

said $\phi_1$ being approximately 90° and said $\phi_2$ being approximately 45°.

* * * * *